(12) United States Patent
Park et al.

(10) Patent No.: US 10,642,437 B2
(45) Date of Patent: May 5, 2020

(54) ELECTRONIC DEVICE AND METHOD FOR CONTROLLING DISPLAY IN ELECTRONIC DEVICE

(71) Applicant: Samsung Electronics Co., Ltd., Suwon-si, Gyeonggi-do (KR)

(72) Inventors: Sun-Young Park, Seoul (KR); Jeong-Won Ko, Seoul (KR); Joong-Hun Kwon, Seoul (KR); Chang-Hwan Kim, Seoul (KR); Sang-Deuk Nam, Suwon-si (KR); Seung-Wook Nam, Bucheon-si (KR); Myoung-Soo Park, Hwaseong-si (KR); Kyung-Jun Lee, Suwon-si (KR); Dong-Oh Lee, Seongnam-si (KR); Jun-Won Jung, Seoul (KR); Hui-Chul Yang, Yongin-si (KR); Hyun-Yeul Lee, Seoul (KR); Soojin Jeong Lim, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/558,821

(22) Filed: Sep. 3, 2019

(65) Prior Publication Data

US 2019/0391690 A1    Dec. 26, 2019

Related U.S. Application Data

(63) Continuation of application No. 15/783,432, filed on Oct. 13, 2017, now Pat. No. 10,444,920.

(30) Foreign Application Priority Data

Oct. 17, 2016  (KR) .................. 10-2016-0134268

(51) Int. Cl.
  *G06F 3/00*    (2006.01)
  *G06F 3/044*   (2006.01)
  (Continued)

(52) U.S. Cl.
  CPC ............ *G06F 3/044* (2013.01); *G06F 3/0202* (2013.01); *G06F 3/04886* (2013.01);
  (Continued)

(58) Field of Classification Search
  CPC .... G06F 3/044; G06F 3/0202; G06F 3/04886; H01H 13/66; H03K 17/9622; H03K 17/98
  (Continued)

(56) References Cited

U.S. PATENT DOCUMENTS 9,041,652 B2    5/2015  Elias et al.
2011/0043434 A1*  2/2011  Roncalez ............ G06F 3/04847
                                        345/3.1
(Continued)

FOREIGN PATENT DOCUMENTS

CN    103064629 B    6/2016
EP     2860622 A1    4/2015
(Continued)

OTHER PUBLICATIONS

Extended European Search Report dated Aug. 28, 2019, issued in a counterpart European application No. 17862147.0-1231/3523716.
(Continued)

*Primary Examiner* — Ojiako K Nwugo
(74) *Attorney, Agent, or Firm* — Jefferson IP Law, LLP

(57) ABSTRACT

An electronic device is provided. The electronic device includes a touchscreen, at least one processor electrically connected with the touchscreen, and a memory electrically connected with the processor. The memory may store instructions executed to enable the at least one processor to
(Continued)

display a first window for running a first application and a second window for running a second application on the touchscreen, display a virtual keypad on a portion of the first window and a portion of the second window corresponding to a first input to a focused window of the first window and the second window, and vary a size of the virtual keypad corresponding to a second input to the virtual keypad.

13 Claims, 12 Drawing Sheets

(51) Int. Cl.
G06F 3/02 (2006.01)
H03K 17/98 (2006.01)
H03K 17/96 (2006.01)
H01H 13/66 (2006.01)
G06F 3/0488 (2013.01)

(52) U.S. Cl.
CPC ......... *H01H 13/66* (2013.01); *H03K 17/9622* (2013.01); *H03K 17/98* (2013.01); *G06F 2203/04803* (2013.01); *G06F 2203/04806* (2013.01)

(58) Field of Classification Search
USPC .............................................. 340/22; 341/22
See application file for complete search history.

(56) References Cited

U.S. PATENT DOCUMENTS

| | | | | |
|---|---|---|---|---|
| 2011/0296333 | A1* | 12/2011 | Bateman | G06F 3/04883 715/773 |
| 2012/0062465 | A1* | 3/2012 | Spetalnick | G06F 3/0236 345/168 |
| 2012/0084698 | A1* | 4/2012 | Sirpal | G06F 1/1616 715/773 |
| 2012/0117506 | A1 | 5/2012 | Koch et al. | |
| 2012/0206363 | A1* | 8/2012 | Kyprianou | G06F 3/04883 345/168 |
| 2013/0057475 | A1* | 3/2013 | Duggan | G06F 3/04886 345/168 |
| 2013/0234942 | A1 | 9/2013 | Yoo et al. | |
| 2013/0290894 | A1* | 10/2013 | Aides | G06F 3/04886 715/773 |
| 2014/0089833 | A1 | 3/2014 | Hwang et al. | |
| 2014/0189566 | A1 | 7/2014 | Kim | |
| 2014/0285422 | A1* | 9/2014 | Kang | G06F 3/04883 345/156 |
| 2014/0333632 | A1* | 11/2014 | Kim | G06F 3/0486 345/467 |
| 2015/0095833 | A1* | 4/2015 | Kim | G06F 3/04886 715/773 |
| 2015/0186040 | A1 | 7/2015 | Yang et al. | |
| 2015/0192989 | A1* | 7/2015 | Kim | G06F 3/011 345/156 |
| 2015/0205488 | A1* | 7/2015 | Yi | G06F 3/04817 715/769 |
| 2015/0261431 | A1* | 9/2015 | Ohtsuka | G06F 3/04886 345/173 |
| 2015/0301665 | A1* | 10/2015 | Kim | G06F 3/0488 345/173 |
| 2015/0301740 | A1* | 10/2015 | Bozzini | G06F 3/04886 715/773 |
| 2015/0309997 | A1* | 10/2015 | Lee | G06F 1/1626 704/3 |
| 2015/0370285 | A1* | 12/2015 | Almosa | G04G 21/025 434/245 |
| 2016/0034140 | A1 | 2/2016 | Navsariwala et al. | |
| 2016/0048270 | A1 | 2/2016 | An et al. | |
| 2016/0103544 | A1* | 4/2016 | Filiz | G06F 3/0414 345/174 |
| 2016/0139803 | A1 | 5/2016 | Yan | |
| 2016/0147384 | A1 | 5/2016 | Hong et al. | |
| 2016/0170614 | A1 | 6/2016 | Chun et al. | |
| 2016/0259548 | A1* | 9/2016 | Ma | G06F 1/1626 |
| 2016/0370864 | A1* | 12/2016 | Choi | G06F 3/0488 |
| 2017/0109039 | A1* | 4/2017 | Lemay | G06F 3/04886 |
| 2017/0109780 | A1* | 4/2017 | Moore | G06Q 30/0244 |
| 2018/0173360 | A1* | 6/2018 | Wang | G06F 3/0416 |

FOREIGN PATENT DOCUMENTS

| | | |
|---|---|---|
| KR | 10-2016-0062414 A | 6/2016 |
| KR | 10-2016-0071133 A | 6/2016 |
| WO | 2015/088123 A1 | 6/2015 |

OTHER PUBLICATIONS

International Search Report dated Jan. 22, 2018, issued in an International application No. PCT/KR2017/011415.
iPad User Guide for iOS 10.3 manual; Sep. 13, 2016.
https://www.youtube.com/watch?v=se0kucTrNXk; May 11, 2014.

* cited by examiner

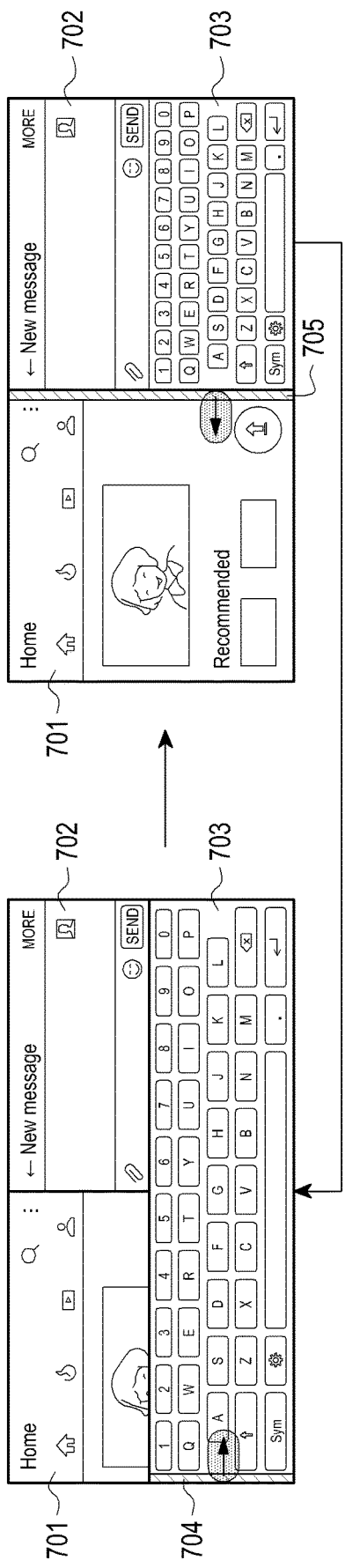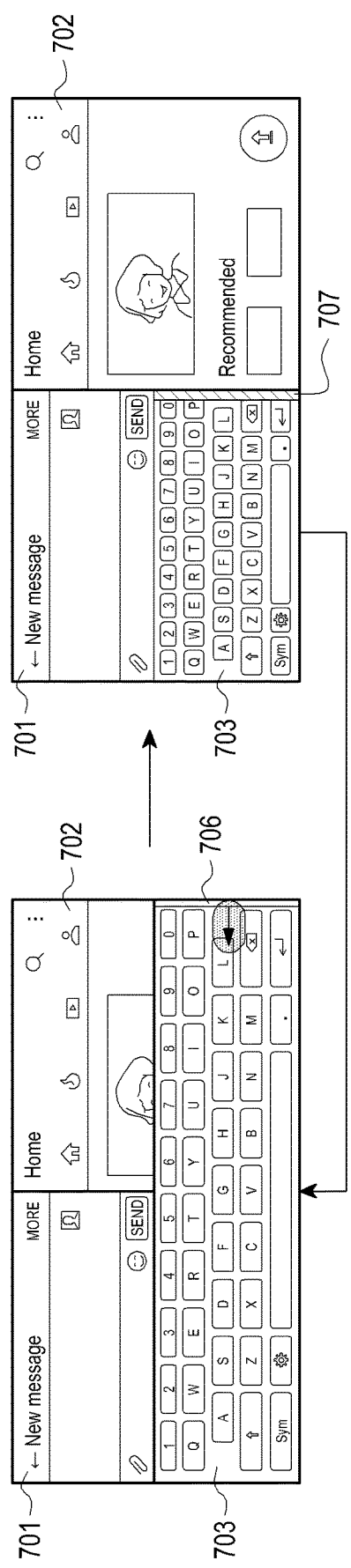

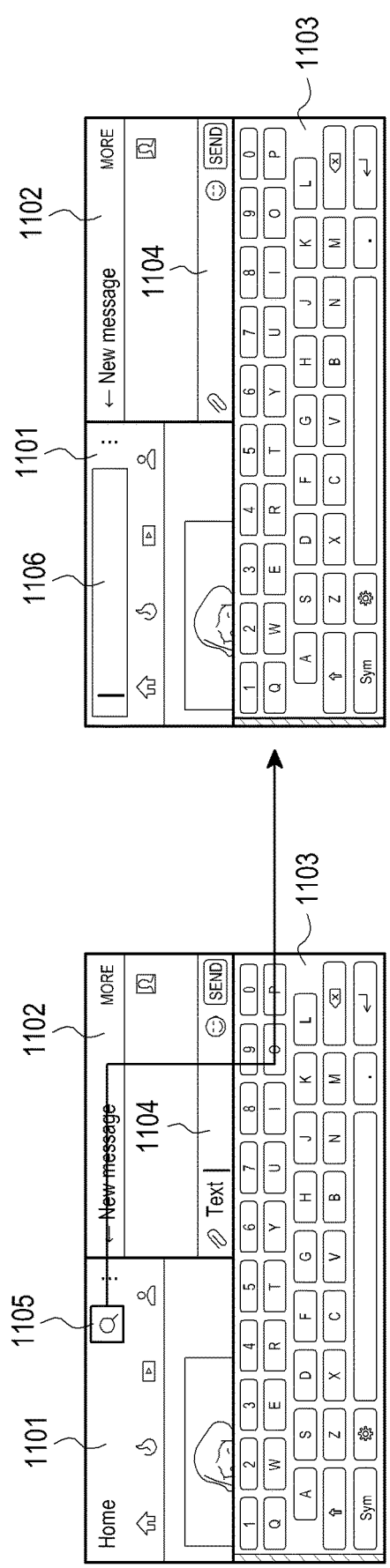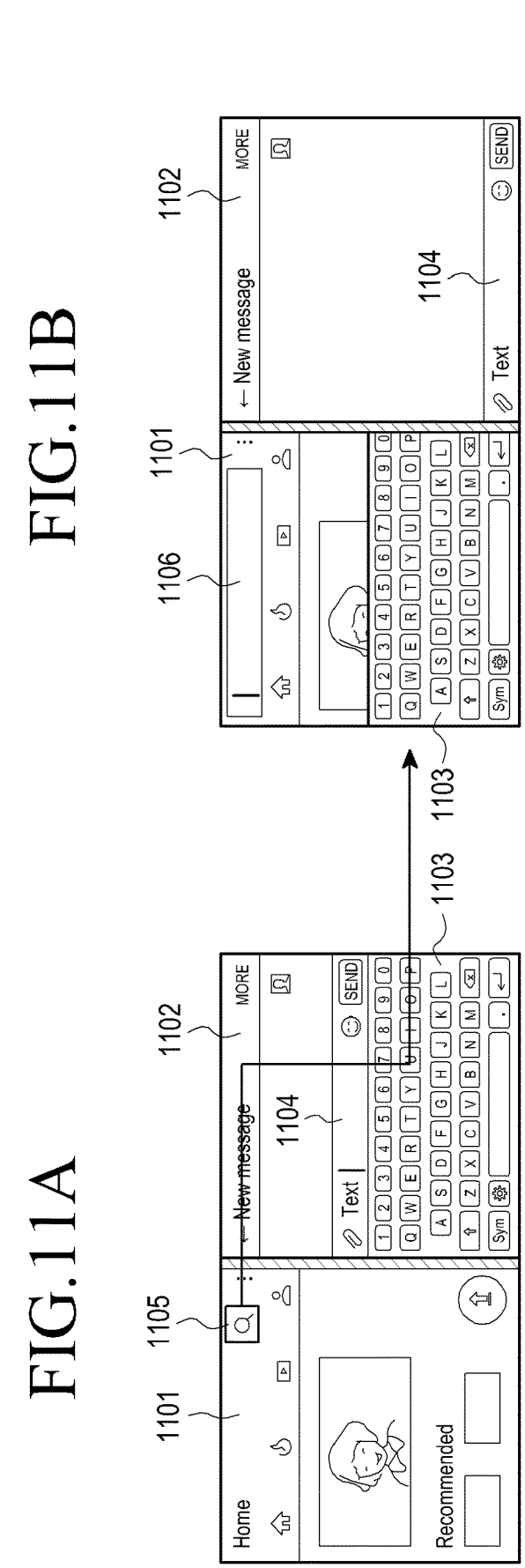
FIG.11A  FIG.11B  FIG.11C  FIG.11D

ELECTRONIC DEVICE AND METHOD FOR CONTROLLING DISPLAY IN ELECTRONIC DEVICE

CROSS-REFERENCE TO RELATED APPLICATION(S)

This application is a continuation application of prior application Ser. No. 15/783,432, filed on Oct. 13, 2017, which based on and claimed priority under 35 U.S.C. § 119(a) of a Korean patent application filed on Oct. 17, 2016 in the Korean Intellectual Property Office and assigned Serial number 10-2016-0134268, the entire disclosure of which is hereby incorporated by reference.

TECHNICAL FIELD

The present disclosure relates to electronic devices and methods for controlling displays in electronic devices.

BACKGROUND

The growth of electronic technology led to the development and spread of various types of electronic devices, such as smartphones or tablet personal computers (PCs). As electronic devices provide various complex functions, techniques for controlling displays in electronic devices are recently under development, allowing users to utilize various functions of the electronic devices in a more convenient way. For example, multi-window technology recently developed may split one display screen into at least two windows, allowing for easier arrangement and execution of multiple applications.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide an electronic device and method for controlling a display in an electronic device.

Referring to FIGS. 12A, 12B and 12C, the display of an electronic device may be rectangular in shape. While being placed in parallel with the horizontal surface, the display may be operated in a display status as shown in FIG. 12A, e.g., a vertical mode (also referred to as a 'portrait mode') where the horizontal size of the display is smaller than the vertical size of the display or in another display as shown in FIG. 12B, e.g., a horizontal mode (also referred to as a 'landscape mode') where the horizontal size of the display is larger than the vertical size of the display. For example, when the electronic device displays, on the display screen, a virtual keypad 1201 for text entry in the horizontal mode as shown in FIG. 12B, the electronic device may enlarge and display the horizontal size of the keypad 1201 that is displayed on the display screen to correspond to the horizontal size of the electronic device.

As another example, when the electronic device displays, on the display screen, a virtual keypad 1207 corresponding to a first application run on a first window 1203 or a second application run on a second window 1205 on a multi-window screen that includes the first window 1203 and the second window 1205 as shown in FIG. 12C, the electronic device may enlarge and display the horizontal size of the virtual keypad 1207 over the first window 1203 and the second window 1205.

As described above, when the horizontal size of the virtual keypad is enlarged and displayed on the display screen of the electronic device in a single window mode or multi-window mode, the range for the user to manipulate the virtual keypad for text entry may be increased, causing inconvenience.

In accordance with an aspect of the present disclosure, an electronic device is provided. The electronic device includes allowing the user to adjust the keypad displayed on the display screen of the electronic device into a desired size and a method for controlling the display in the electronic device.

In accordance with another aspect of the present disclosure, an electronic device is provided. The electronic device includes a touchscreen, at least one processor electrically connected with the touchscreen, and a memory electrically connected with the processor, wherein the memory may store instructions executed to enable the at least one processor to display a first window for running a first application and a second window for running a second application on the touchscreen, display a virtual keypad on a portion of the first window and a portion of the second window corresponding to a first input to a focused window of the first window and the second window, and vary a size of the virtual keypad corresponding to a second input to the virtual keypad.

In accordance with another aspect of the present disclosure, a method for controlling a display in an electronic device is provided. The method includes displaying a first window for running a first application and a second window for running a second application on a touchscreen of the electronic device, displaying a virtual keypad on a portion of the first window and a portion of the second window corresponding to a first input to a focused window of the first window and the second window, and varying a size of the virtual keypad corresponding to a second input to the virtual keypad.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which:

FIGS. 7A, 7B, 7C, and 7D are views illustrating an operation screen for adjusting the size of the virtual keypad of the electronic device according to various embodiments of FIG. 5;

FIGS. 11A, 11B, 11C, and 11D are views illustrating a movement of a cursor in a text entry area between two applications run on a multi-window screen according to various embodiments of the present disclosure.

Throughout the drawings, like reference numerals will be understood to refer to like parts, components, and structures.

DETAILED DESCRIPTION

Figure 1:
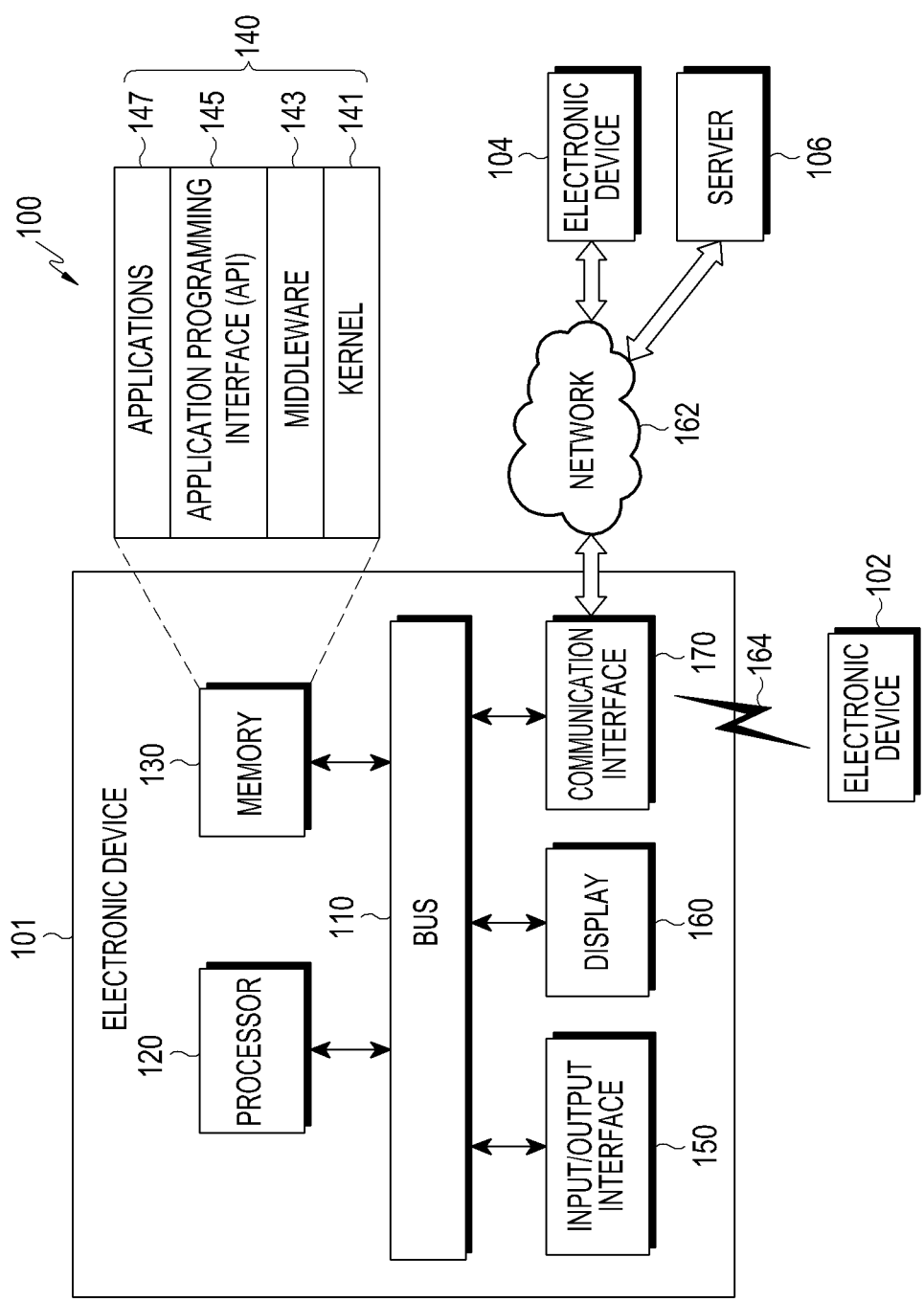
FIG. 1 illustrates a network environment including an electronic device according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural references unless the context clearly dictates otherwise. Thus, for example, reference to "a component surface" includes reference to one or more of such surfaces.

As used herein, the terms "A or B" or "at least one of A and/or B" may include all possible combinations of A and B. As used herein, the terms "first" and "second" may modify various components regardless of importance and/or order and are used to distinguish a component from another without limiting the components. It will be understood that when an element (e.g., a first element) is referred to as being (operatively or communicatively) "coupled with/to," or "connected with/to" another element (e.g., a second element), it can be coupled or connected with/to the other element directly or via a third element.

As used herein, the terms "configured to" may be interchangeably used with other terms, such as "suitable for," "capable of," "modified to," "made to," "adapted to," "able to," or "designed to" in hardware or software in the context. Rather, the term "configured to" may mean that a device can perform an operation together with another device or parts. For example, the term "processor configured (or set) to perform A, B, and C" may mean a generic-purpose processor (e.g., a central processing unit (CPU) or application processor (AP)) that may perform the operations by executing one or more software programs stored in a memory device or a dedicated processor (e.g., an embedded processor) for performing the operations.

For example, examples of the electronic device according to embodiments of the present disclosure may include at least one of a smartphone, a tablet personal computer (PC), a mobile phone, a video phone, an e-book reader, a desktop PC, a laptop computer, a netbook computer, a workstation, a server, a personal digital assistant (PDA), a portable multimedia player (PMP), a moving picture experts group phase 1 or phase 2 (MPEG-1 or MPEG-2) audio layer 3 (MP3) player, a medical device, a camera, or a wearable device. The wearable device may include at least one of an accessory-type device (e.g., a watch, a ring, a bracelet, an anklet, a necklace, glasses, contact lenses, or a head-mounted device (HMD)), a fabric- or clothes-integrated device (e.g., electronic clothes), a body attaching-type device (e.g., a skin pad or tattoo), or a body implantable device. In some embodiments, examples of the smart home appliance may include at least one of a television, a digital versatile disc (DVD) player, an audio player, a refrigerator, an air conditioner, a cleaner, an oven, a microwave oven, a washer, a drier, an air cleaner, a set-top box, a home automation control panel, a security control panel, a television (TV) box (e.g., Samsung HomeSync™, Apple TV™, or Google TV™), a gaming console (Xbox™, Play Station™), an electronic dictionary, an electronic key, a camcorder, or an electronic picture frame.

According to an embodiment of the present disclosure, the electronic device may include at least one of various medical devices (e.g., diverse portable medical measuring devices (a blood sugar measuring device, a heartbeat measuring device, or a body temperature measuring device), a magnetic resource angiography (MRA) device, a magnetic resource imaging (MRI) device, a computed tomography (CT) device, an imaging device, or an ultrasonic device), a navigation device, a global navigation satellite system (GNSS) receiver, an event data recorder (EDR), a flight data recorder (FDR), an automotive infotainment device, an sailing electronic device (e.g., a sailing navigation device or a gyro compass), avionics, security devices, vehicular head units, industrial or home robots, drones, automatic teller's machines (ATMs), point of sales (POS) devices, or internet of things (IoT) devices (e.g., a bulb, various sensors, a sprinkler, a fire alarm, a thermostat, a street light, a toaster, fitness equipment, a hot water tank, a heater, or a boiler). According to various embodiments of the disclosure, examples of the electronic device may at least one of part of a piece of furniture, building/structure or vehicle, an electronic board, an electronic signature receiving device, a projector, or various measurement devices (e.g., devices for measuring water, electricity, gas, or electromagnetic waves). According to embodiments of the present disclosure, the electronic device may be flexible or may be a combination of the above-enumerated electronic devices. According to an embodiment of the disclosure, the electronic devices are not limited to those described above. As used herein, the term "user" may denote a human or another device (e.g., an artificial intelligent electronic device) using the electronic device.

FIG. 1 illustrates a network environment including an electronic device according to an embodiment of the present disclosure.

Referring to FIG. 1, an electronic device 101 is included in a network environment 100. The electronic device 101 may include a bus 110, a processor 120 (e.g., at least one processor), a memory 130, an input/output interface 150, a display 160, and a communication interface 170. In some embodiments, the electronic device 101 may exclude at least one of the components or may add another component. The bus 110 may include a circuit for connecting the components 110 to 170 with one another and transferring communications (e.g., control messages or data) between the components. The processing module or processor 120 may include one or more of a central processing unit (CPU), an application processor (AP), or a communication processor (CP). The processor 120 may perform control on at least one of the other components of the electronic device 101, and/or perform an operation or data processing relating to communication.

The memory 130 may include a volatile and/or nonvolatile memory. For example, the memory 130 may store commands or data related to at least one other component of the electronic device 101. According to an embodiment of the present disclosure, the memory 130 may store software and/or a program 140. The program 140 may include, e.g., a kernel 141, middleware 143, an application programming interface (API) 145, and/or an application program (or "application") 147. At least a portion of the kernel 141, middleware 143, or API 145 may be denoted an operating system (OS). For example, the kernel 141 may control or manage system resources (e.g., the bus 110, processor 120, or a memory 130) used to perform operations or functions implemented in other programs (e.g., the middleware 143, API 145, or application program 147). The kernel 141 may provide an interface that allows the middleware 143, the API 145, or the application 147 to access the individual components of the electronic device 101 to control or manage the system resources.

The middleware 143 may function as a relay to allow the API 145 or the application 147 to communicate data with the kernel 141, for example. Further, the middleware 143 may process one or more task requests received from the application program 147 in order of priority. For example, the middleware 143 may assign a priority of using system resources (e.g., bus 110, processor 120, or memory 130) of the electronic device 101 to at least one of the application programs 147 and process one or more task requests. The API 145 is an interface allowing the application 147 to control functions provided from the kernel 141 or the middleware 143. For example, the API 145 may include at least one interface or function (e.g., a command) for filing control, window control, image processing or text control. For example, the input/output interface 150 may transfer commands or data input from the user or other external device to other component(s) of the electronic device 101 or may output commands or data received from other component(s) of the electronic device 101 to the user or other external devices.

The display 160 may include, e.g., a liquid crystal display (LCD), a light emitting diode (LED) display, an organic LED (OLED) display, or a microelectromechanical systems (MEMS) display, or an electronic paper display. The display 160 may display, e.g., various contents (e.g., text, images, videos, icons, or symbols) to the user. The display 160 may include a touchscreen and may receive, e.g., a touch, gesture, proximity or hovering input using an electronic pen or a body portion of the user. For example, the communication interface 170 may set up communication between the electronic device 101 and an external device (e.g., a first electronic device 102, a second electronic device 104, or a server 106). For example, the communication interface 170 may be connected with a network 162 through wireless communication or wired communication and may communicate with an external device (e.g., the second external electronic device 104 or server 106).

The wireless communication may include cellular communication which uses at least one of, e.g., long term evolution (LTE), LTE-advanced (LTE-A), code division multiple access (CDMA), wideband CDMA (WCDMA), universal mobile telecommunication system (UMTS), wireless broadband (WiBro), or global system for mobile communication (GSM). According to an embodiment of the present disclosure, the wireless communication may include at least one of, e.g., wireless fidelity (Wi-Fi), Bluetooth (BT), Bluetooth low power (BLE), zigbee, near field communication (NFC), magnetic secure transmission (MST), radio frequency, or body area network (BAN). According to an embodiment of the present disclosure, the wireless communication may include GNSS. The GNSS may be, e.g., global positioning system (GPS), global navigation satellite system (Glonass), Beidou navigation satellite system (hereinafter, "Beidou") or Galileo, or the European global satellite-based navigation system. Hereinafter, the terms "GPS" and the "GNSS" may be interchangeably used herein. The wired connection may include at least one of, e.g., universal serial bus (USB), high definition multimedia interface (HDMI), recommended standard (RS)-232, power line communication (PLC), or plain old telephone service (POTS). The network 162 may include at least one of telecommunication networks, e.g., a computer network (e.g., local area network (LAN) or wide area network (WAN)), Internet, or a telephone network.

The first and second external electronic devices 102 and 104 each may be a device of the same or a different type from the electronic device 101. According to an embodiment of the present disclosure, all or some of operations executed on the electronic device 101 may be executed on another or multiple other electronic devices (e.g., the electronic devices 102 and 104 or server 106). According to an embodiment of the present disclosure, when the electronic device 101 should perform some function or service automatically or at a request, the electronic device 101, instead of executing the function or service on its own or additionally, may request another device (e.g., electronic devices 102 and 104 or server 106) to perform at least some functions associated therewith. The other electronic device (e.g., electronic devices 102 and 104 or server 106) may execute the requested functions or additional functions and transfer a result of the execution to the electronic device 101. The electronic device 101 may provide a requested function or service by processing the received result as it is or additionally. To that end, a cloud computing, distributed computing, or client-server computing technique may be used, for example.

Figure 2:
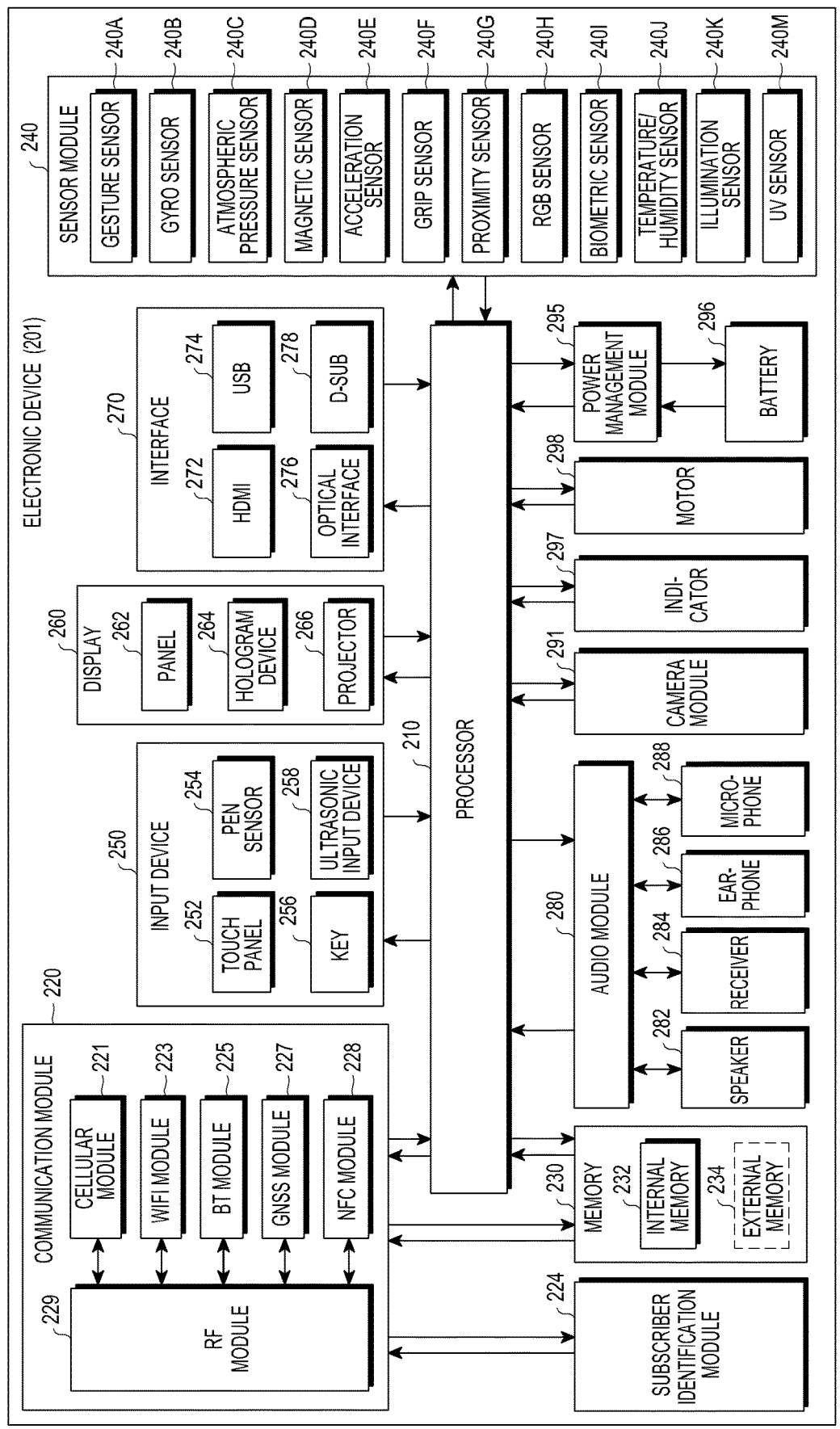
FIG. 2 is a block diagram illustrating an electronic device according to an embodiment of the present disclosure.

FIG. 2 is a block diagram illustrating an electronic device according to an embodiment of the present disclosure.

Referring to FIG. 2, the electronic device 201 may include the whole or part of the configuration of, e.g., the electronic device 101 shown in FIG. 1. The electronic device 201 may include one or more processors (e.g., application processors (APs)) 210, a communication module 220, a subscriber identification module (SIM) 224, a memory 230, a sensor module 240, an input device 250, a display 260, an interface 270, an audio module 280, a camera module 291, a power management module 295, a battery 296, an indicator 297, and a motor 298. The processor 210 may control multiple hardware and software components connected to the processor 210 by running, e.g., an operating system (OS) or application programs, and the processor 210 may process and compute various data. The processor 210 may be implemented in, e.g., a system on chip (SoC). According to an embodiment of the present disclosure, the processor 210 may further include a graphic processing unit (GPU) and/or an image signal processor (ISP). The processor 210 may include at least some (e.g., the cellular module 221) of the components shown in FIG. 2. The processor 210 may load a command or data received from at least one of other components (e.g., a non-volatile memory) on a volatile memory, process the command or data, and store resultant data in the non-volatile memory.

The communication module 220 may have the same or similar configuration to the communication interface 170. The communication module 220 may include, e.g., a cellular module 221, a Wi-Fi module 223, a Bluetooth (BT) module 225, a GNSS module 227, a NFC module 228, and a RF module 229. The cellular module 221 may provide voice call, video call, text, or Internet services through, e.g., a communication network. The cellular module 221 may perform identification or authentication on the electronic device 201 in the communication network using a subscriber identification module (SIM) 224 (e.g., the SIM card). According to an embodiment of the present disclosure, the cellular module 221 may perform at least some of the functions providable by the processor 210. According to an embodiment of the present disclosure, the cellular module 221 may include a communication processor (CP). According to an embodiment of the present disclosure, at least some (e.g., two or more) of the cellular module 221, the Wi-Fi module 223, the Bluetooth (BT) module 225, the GNSS module 227, or the NFC module 228 may be included in a single integrated circuit (IC) or an IC package. The RF module 229 may communicate data, e.g., communications signals (e.g., RF signals). The RF module 229 may include, e.g., a transceiver, a power amp module (PAM), a frequency filter, a low noise amplifier (LNA), or an antenna. According to an embodiment of the present disclosure, at least one of the cellular module 221, the Wi-Fi module 223, the BT module 225, the GNSS module 227, or the NFC module 228 may communicate RF signals through a separate RF module. The subscription identification module 224 may include, e.g., a card including a subscriber identification module (SIM, or an embedded SIM, and may contain unique identification information (e.g., an integrated circuit card identifier (ICCID) or subscriber information (e.g., an international mobile subscriber identity (IMSI)).

The memory 230 (e.g., the memory 130) may include, e.g., an internal memory 232 or an external memory 234. The internal memory 232 may include at least one of, e.g., a volatile memory (e.g., a dynamic read only memory (DRAM), a static random access memory (SRAM), a synchronous DRAM (SDRAM), etc.) or a non-volatile memory (e.g., a one-time programmable ROM (OTPROM), a programmable ROM (PROM), an erasable and programmable ROM (EPROM), an electrically erasable and programmable ROM (EEPROM), a mask ROM, a flash ROM, a flash memory (e.g., a NAND flash, or a NOR flash), a hard drive, or solid state drive (SSD). The external memory 234 may include a flash drive, e.g., a compact flash (CF) memory, a secure digital (SD) memory, a micro-SD memory, a min-SD memory, an extreme digital (xD) memory, a multi-media card (MMC), or a Memory Stick™. The external memory 234 may be functionally or physically connected with the electronic device 201 via various interfaces.

For example, the sensor module 240 may measure a physical quantity or detect an operational state of the electronic device 201, and the sensor module 240 may convert the measured or detected information into an electrical signal. The sensor module 240 may include at least one of, e.g., a gesture sensor 240A, a gyro sensor 240B, an atmospheric pressure sensor 240C, a magnetic sensor 240D, an acceleration sensor 240E, a grip sensor 240F, a proximity sensor 240G, a color sensor 240H (e.g., a red-green-blue (RGB) sensor, a bio sensor 240I, a temperature/humidity sensor 240J, an illumination sensor 240K, or an ultra violet (UV) sensor 240M. Additionally or alternatively, the sensing module 240 may include, e.g., an e-nose sensor, an electromyography (EMG) sensor, an electroencephalogram (EEG) sensor, an electrocardiogram (ECG) sensor, an infrared (IR) sensor, an iris sensor, or a finger print sensor. The sensor module 240 may further include a control circuit for controlling at least one or more of the sensors included in the sensing module. According to an embodiment of the present disclosure, the electronic device 201 may further include a processor configured to control the sensor module 240 as part of the processor 210 or separately from the processor 210, and the electronic device 201 may control the sensor module 240 while the processor 210 is in a sleep mode.

The input unit 250 may include, e.g., a touch panel 252, a (digital) pen sensor 254, a key 256, or an ultrasonic input device 258. The touch panel 252 may use at least one of capacitive, resistive, infrared (IR), or ultrasonic methods. The touch panel 252 may further include a control circuit. The touch panel 252 may further include a tactile layer and may provide a user with a tactile reaction. The (digital) pen sensor 254 may include, e.g., a part of a touch panel or a separate sheet for recognition. The key 256 may include e.g., a physical button, optical key or key pad. The ultrasonic input device 258 may sense an ultrasonic wave generated from an input tool through a microphone (e.g., the microphone 288) to identify data corresponding to the sensed ultrasonic wave.

The display 260 (e.g., the display 160) may include a panel 262, a hologram device 264, a projector 266, and/or a control circuit for controlling the same. The panel 262 may be implemented to be flexible, transparent, or wearable. The panel 262, together with the touch panel 252, may be configured in one or more modules. According to an embodiment of the present disclosure, the panel 262 may include a pressure sensor (or pose sensor) that may measure the strength of a pressure by the user's touch. The pressure sensor may be implemented in a single body with the touch panel 252 or may be implemented in one or more sensors separate from the touch panel 252. The hologram device 264 may make three dimensional (3D) images (holograms) in the air by using light interference. The projector 266 may display an image by projecting light onto a screen. The screen may be, for example, located inside or outside of the electronic device 201. The interface 270 may include e.g., a high definition multimedia interface (HDMI) 272, a USB 274, an optical interface 276, or a D-subminiature (D-sub) 278. The interface 270 may be included in e.g., the communication interface 170 shown in FIG. 1. Additionally or alternatively, the interface 270 may include a mobile high-definition link (MHL) interface, a secure digital (SD) card/multimedia card (MMC) interface, or infrared data association (IrDA) standard interface.

The audio module 280 may converting, e.g., a sound signal into an electrical signal and vice versa. At least a part of the audio module 280 may be included in e.g., the input/output interface 145 as shown in FIG. 1. The audio module 280 may process sound information input or output through e.g., a speaker 282, a receiver 284, an earphone 286, or a microphone 288. For example, the camera module 291 may be a device for capturing still images and videos, and may include, according to an embodiment of the present disclosure, one or more image sensors (e.g., front and back sensors), a lens, an image signal processor (ISP), or a flash such as an LED or xenon lamp. The power manager module 295 may manage power of the electronic device 201, for example. According to an embodiment of the present disclosure, the power manager module 295 may include a power management Integrated circuit (PMIC), a charger IC, or a battery or fuel gauge. The PMIC may have a wired and/or wireless recharging scheme. The wireless charging scheme may include e.g., a magnetic resonance scheme, a magnetic induction scheme, or an electromagnetic wave based scheme, and an additional circuit, such as a coil loop, a resonance circuit, a rectifier, or the like may be added for wireless charging. The battery gauge may measure an amount of remaining power of the battery 296, a voltage, a current, or a temperature while the battery 296 is being charged. The battery 296 may include, e.g., a rechargeable battery or a solar battery.

The indicator 297 may indicate a particular state of the electronic device 201 or a part (e.g., the processor 210) of the electronic device, including e.g., a booting state, a message state, or recharging state. The motor 298 may convert an electric signal to a mechanical vibration and may generate a vibrational or haptic effect. The electronic device 201 may include a mobile TV supporting device (e.g., a GPU) that may process media data as per, e.g., digital multimedia broadcasting (DMB), digital video broadcasting (DVB), or mediaFlo™ standards. Each of the aforementioned components of the electronic device may include one or more parts, and a name of the part may vary with a type of the electronic device. According to various embodiments, the electronic device (e.g., the electronic device 201) may exclude some elements or include more elements, or some of the elements may be combined into a single entity that may perform the same function as by the elements before combined.

Figure 3:
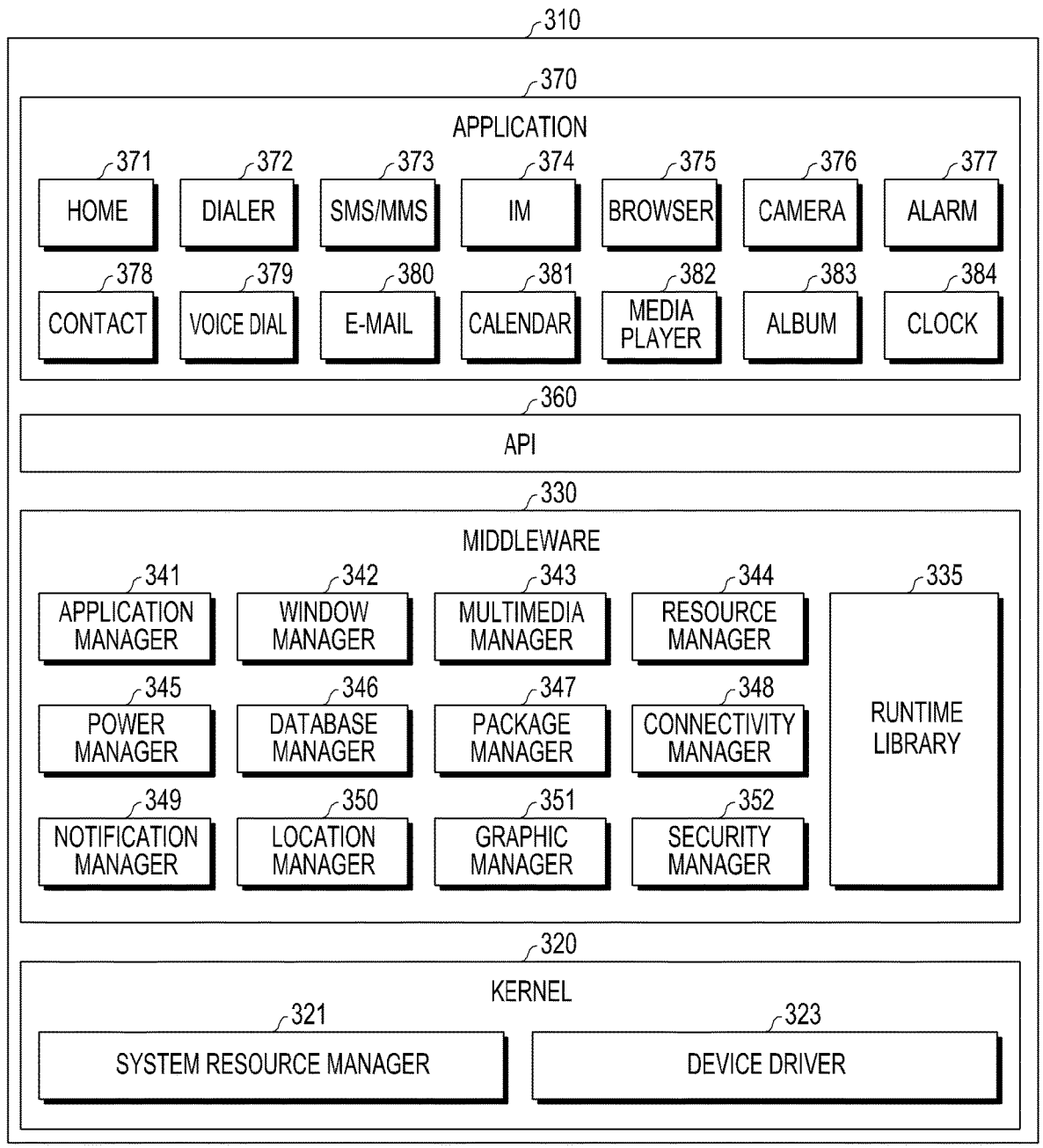
FIG. 3 is a block diagram illustrating a program module according to an embodiment of the present disclosure.

FIG. 3 is a block diagram illustrating a program module according to an embodiment of the present disclosure.

According to an embodiment of the present disclosure, the program module 310 (e.g., the program 140) may include an operating system (OS) controlling resources related to the electronic device (e.g., the electronic device 101) and/or various applications (e.g., the application processor (AP) 147) driven on the operating system. The operating system may include, e.g., Android™, iOS™, Windows™, Symbian™ Tizen™, or Bada™.

Referring to FIG. 3, the program module 310 may include a kernel 320 (e.g., the kernel 141), middleware 330 (e.g., the middleware 143), an API 360 (e.g., the API 145), and/or an application 370 (e.g., the application program 147). At least a part of the program module 310 may be preloaded on the electronic device or may be downloaded from an external electronic device (e.g., the electronic devices 102 and 104 or server 106).

The kernel 320 may include, e.g., a system resource manager 321 or a device driver 323. The system resource manager 321 may perform control, allocation, or recovery of system resources. According to an embodiment of the present disclosure, the system resource manager 321 may include a process managing unit, a memory managing unit, or a file system managing unit. The device driver 323 may include, e.g., a display driver, a camera driver, a Bluetooth driver, a shared memory driver, a USB driver, a keypad driver, a Wi-Fi driver, an audio driver, or an inter-process communication (IPC) driver. The middleware 330 may provide various functions to the application 370 through the API 360 so that the application 370 may use limited system resources in the electronic device or provide functions jointly required by applications 370. According to an embodiment of the present disclosure, the middleware 330 may include at least one of a runtime library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, or a security manager 352.

The runtime library 335 may include a library module used by a compiler in order to add a new function through a programming language while, e.g., the application 370 (e.g., at least one application) is being executed. The runtime library 335 may perform input/output management, memory management, or arithmetic function processing. The application manager 341 may manage the life cycle of, e.g., the application 370. The window manager 342 may manage GUI resources used on the screen. The multimedia manager 343 may grasp formats necessary to play media files and use a codec appropriate for a format to perform encoding or decoding on media files. The resource manager 344 may manage the source code or memory space of the application 370. The power manager 345 may manage, e.g., the battery capability or power and provide power information necessary for the operation of the electronic device. According to an embodiment of the present disclosure, the power manager 345 may interwork with a basic input/output system (BIOS). The database manager 346 may generate, search, or convert a database to be used in the application 370. The package manager 347 may manage installation or update of an application that is distributed in the form of a package file.

The connectivity manager 348 may manage, e.g., wireless connectivity. The notification manager 349 may provide an event, e.g., arrival message, appointment, or proximity alert, to the user. The location manager 350 may manage, e.g., locational information on the electronic device. The graphic manager 351 may manage, e.g., graphic effects to be offered to the user and their related user interface. The security manager 352 may provide system security or user authentication, for example. According to an embodiment of the present disclosure, the middleware 330 may include a telephony manager for managing the voice or video call function of the electronic device or a middleware module able to form a combination of the functions of the above-described elements. According to an embodiment of the present disclosure, the middleware 330 may provide a module specified according to the type of the operating system. The middleware 330 may dynamically omit some existing components or add new components. The API 360 may be a set of, e.g., API programming functions and may have different configurations depending on operating systems. For example, in the case of Android or iOS, one API set may be provided per platform, and in the case of Tizen, two or more API sets may be offered per platform.

The application 370 may include an application that may provide, e.g., a home 371, a dialer 372, an SMS/MMS 373, an instant message (IM) 374, a browser 375, a camera 376, an alarm 377, a contact 378, a voice dial 379, an email 380, a calendar 381, a media player 382, an album 383, or a clock 384, a health-care (e.g., measuring the degree of workout or blood sugar), or provision of environmental information (e.g., provision of air pressure, moisture, or temperature information). According to an embodiment of the present disclosure, the application 370 may include an information exchanging application supporting information exchange between the electronic device and an external electronic device. Examples of the information exchange application may include, but is not limited to, a notification relay application for transferring specific information to the external electronic device, or a device management application for managing the external electronic device. For example, the notification relay application may transfer notification information generated by other application of the electronic device to the external electronic device or receive notification information from the external electronic device and provide the received notification information to the user. For example, the device management application may install, delete, or update a function (e.g., turn-on/turn-off the external electronic device (or some elements) or adjusting the brightness (or resolution) of the display) of the external electronic device communicating with the electronic device or an application operating on the external electronic device. According to an embodiment of the present disclosure, the application 370 may include an application (e.g., a health-care application of a mobile medical device) designated according to an attribute of the external electronic device. According to an embodiment of the present disclosure, the application 370 may include an application received from the external electronic device. At least a portion of the program module 310 may be implemented (e.g., executed) in software, firmware, hardware (e.g., the processor 210), or a combination of at least two or more thereof and may include a module, program, routine, command set, or process for performing one or more functions.

According to an embodiment of the present disclosure, an electronic device (e.g., the electronic device 101) may comprise a touchscreen (e.g., the display 160), at least one processor (e.g., the processor 120) electrically connected with the touchscreen, and a memory (e.g., the memory 130) electrically connected with the processor, wherein the memory may store instructions executed to enable the processor to display a first window for running a first application and a second window for running a second application on the touchscreen, display a virtual keypad on a portion of the first window and a portion of the second window corresponding to a first input to a focused window of the first window and the second window, and vary a size of the virtual keypad corresponding to a second input to the virtual keypad.

For example, the instructions may enable the processor to, when a drag input on a side of the virtual keypad is received, and a length of the drag input is a designated threshold or more, vary the size of the virtual keypad into a designated size according to a direction of the drag input and display the virtual keypad.

For example, a left side of the virtual keypad may be positioned on a left side of the first window, and a right side of the virtual keypad may be positioned on a right side of the second window that is disposed in parallel with the first window.

For example, the instructions may enable the processor to, when a drag input from a left side of the virtual keypad to a right side of the virtual keypad is received, and a length of the drag input is a designated threshold or more, vary the size of the virtual keypad so that the left side of the virtual keypad is positioned on a left side of the second window and display the virtual keypad. The drag input may start at the left side of the virtual keypad.

For example, the instructions may enable the processor to, when a drag input from a right side of the virtual keypad to a left side of the virtual keypad is received, and a length of the drag input is a designated threshold or more, vary the size of the virtual keypad so that the right side of the virtual keypad is positioned on a right side of the first window and display the virtual keypad. The drag input may start at the right side of the virtual keypad.

For example, wherein the instructions may enable the processor to, when a drag input on a side of the virtual keypad is received, vary the size of the virtual keypad in a direction of the drag in proportion to a length of the drag input and display the virtual keypad.

For example, the touchscreen may have a rectangular shape with a horizontal size and a vertical size different from the horizontal size. The electronic device may be operated in a horizontal mode where the first window and the second window are displayed in parallel with each other in a vertical direction of the touchscreen. The first window and the second window may not overlap each other.

For example, the virtual keypad may be positioned in an area of the first window. The instructions may enable the processor to, when a drag input for a boundary between the first window and the second window is received, move the boundary in a direction of the drag input for the boundary in proportion to a length of the drag input for the boundary to adjust a horizontal size of the first window, the second window, and the virtual keypad.

For example, the instructions may enable the processor to display a cursor on a text entry window of an application run on the focused window, and upon receiving a third input for a text entry window of the first window or the second window which is not the focused window, terminate the display of the cursor and display the cursor on a text entry window where the third input is sensed.

For example, the instructions may enable the processor to display the virtual keypad on a portion of the first window upon receiving a touch input to a text entry window of the first application of the first window while the virtual keypad is displayed on a portion of the second window.

For example, the touchscreen may be a single screen.

Figure 4:
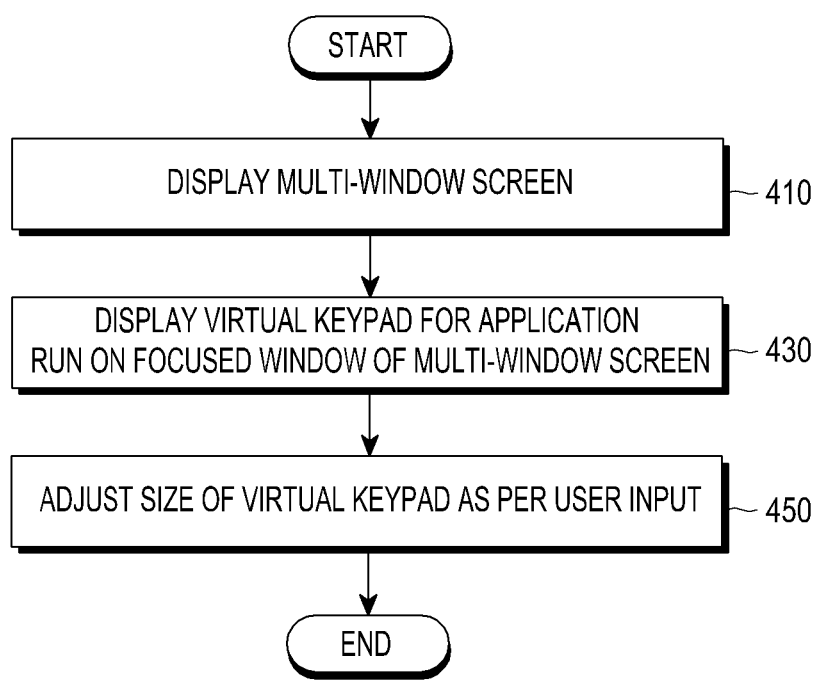
FIG. 4 is a flowchart illustrating operations for controlling a display screen of an electronic device according to an embodiment of the present disclosure.

FIG. 4 is a flowchart illustrating operations for controlling a display screen of an electronic device according to an embodiment of the present disclosure.

Referring to FIG. 4, an electronic device may be operated on a multi-window screen including at least two windows in which case the electronic device may adjust the size of a virtual keyboard displayed on the display according to a user input.

In operation 410, the electronic device may display a multi-window screen. For example, the multi-window screen may include a first window for running a first application and a second window for running a second application. The first window and the second window may partially overlap or may be separately displayed.

In operation 430, the electronic device may display a virtual keypad for an application run on the window that is focused on the multi-window screen. For example, the electronic device may focus the first window or the second window according to a user input (e.g., a touch). The electronic device may display a virtual keypad for the first application run on the first window or the second application run on the second window according to a user input. The virtual keypad may be displayed on a portion of the first window or a portion of the second window. The horizontal size of the virtual keypad may be the same (or correspond to the horizontal size of the display of the electronic device) as the sum of the horizontal size of the first window and the horizontal size of the second window.

In operation 450, the electronic device may adjust the size of the virtual keypad according to a user input. For example, the electronic device may adjust the size of the virtual keypad according to a drag input on a portion of the virtual keypad. The electronic device may adjust the size of the virtual keypad according to the length of the drag input and the direction of the drag input. The portion of the virtual keypad may be an upper, lower, left, or right side (also referred to as an edge) portion of the virtual keypad.

Figure 5:
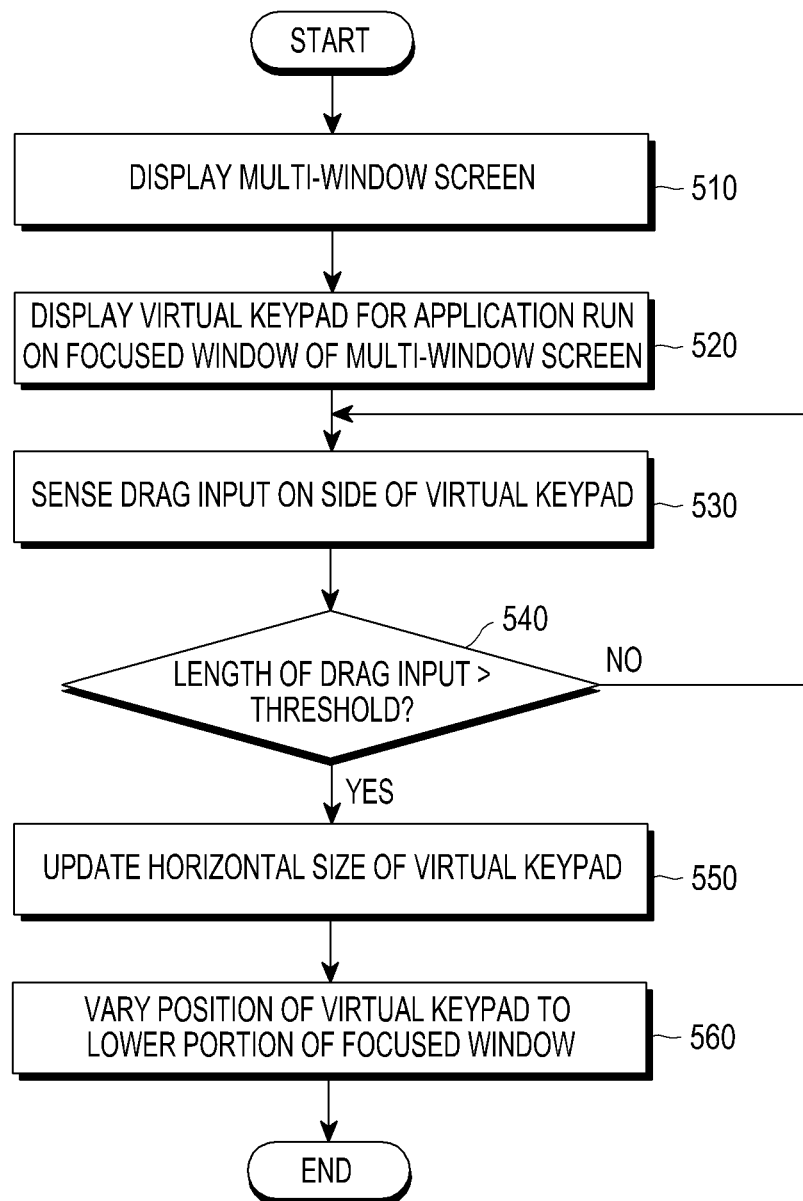
FIG. 5 is a flowchart illustrating operations for adjusting the size of a virtual keypad of an electronic device according to an embodiment of the present disclosure.

FIG. 5 is a flowchart illustrating operations for adjusting the size of a virtual keypad of an electronic device according to an embodiment of the present disclosure. FIGS. 6A to 6D are views illustrating operations for adjusting the size of a virtual keypad of an electronic device according to various embodiments of the present disclosure.

Referring to FIG. 5 and FIGS. 6A to 6D, the electronic device may adjust the size of the virtual keypad to correspond to the size of one of the windows included in the multi-window screen according to a user input.

In operation 510, the electronic device may display a multi-window screen.

Figure 6B:
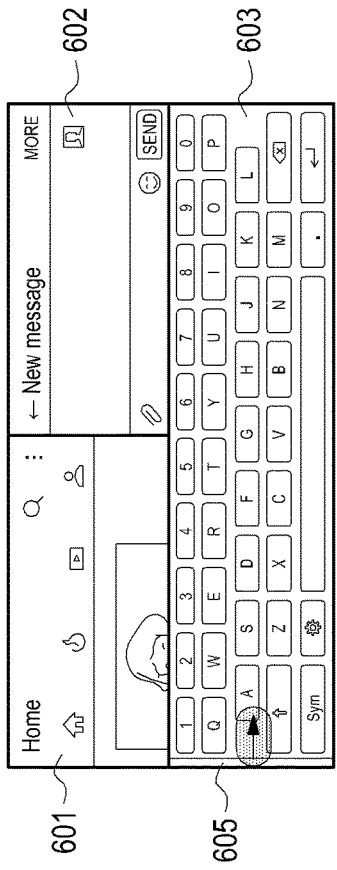
FIGS. 6A, 6B, 6C, and 6D are views illustrating operations for adjusting the size of a virtual keypad of an electronic device according to various embodiments of the present disclosure.
Figure 6D:
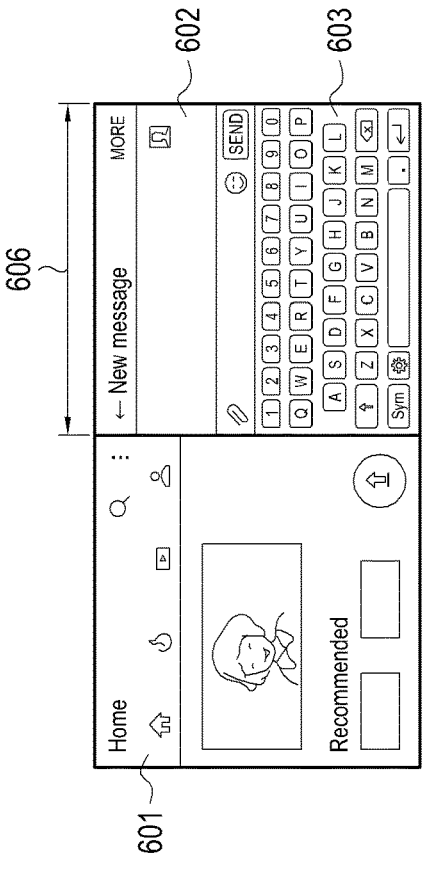
Figure 6A:
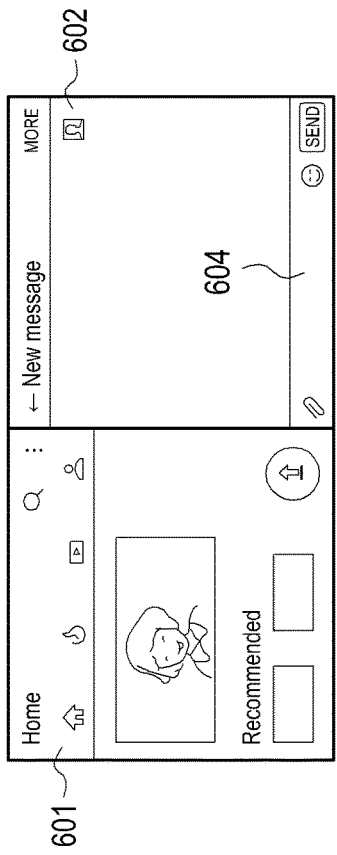

Referring to FIG. 6A, the electronic device may be operated in a display status as shown in FIG. 6A, e.g., a horizontal mode (also referred to as a 'landscape mode') where the horizontal size is larger than the vertical size. The electronic device, when being operated in a multi-window and horizontal mode, may split the display screen into two areas and may display a first window 601 on a left-hand display screen and a second window 602 on a right-hand display screen as shown in FIG. 6A. The first window 601 may display an execution screen of a first application, and the second window 602 may display an execution screen of a second application.

In operation 520, the electronic device may display a virtual keypad for an application run on the window that is focused on the multi-window screen.

Upon receiving a user input for running a virtual keypad for the second application run on the second window 602 while displaying the first window 601 and the second window 602 in the horizontal mode as shown in FIG. 6A, the electronic device may display a virtual keypad 603 on a portion of the first window 601 and a portion of the second window 602 as shown in FIG. 6B. For example, upon sensing a touch on a text entry window 604 of the execution screen of the second application, the electronic device may display the virtual keypad 603 on the lower portion of the first window 601 and the second window 602 as shown in FIG. 6B. For example, the electronic device may reduce the vertical size of the display screen of the second application, generate an area, where a portion of the virtual keypad 603 may be positioned, in the lower portion of the second window 602, and display the virtual keypad 603 on the area generated in the lower portion of the second window 602 and a lower portion of the first window 601. As another example, the electronic device may reduce both the vertical size of the display screen of the first application and the vertical size of the display screen of the second application, generate an area, where the virtual keypad 603 may be positioned, and display the virtual keypad 603 on the area generated in the lower portion of the first window 601 and the area generated in the lower portion of the second window 602.

In operation 530, the electronic device may sense a drag input on a side of the virtual keypad. For example, when the user drags a left-hand side 605 of the virtual keypad 603 to the right where the second window 602 is positioned as shown in FIG. 6B, the electronic device may sense the drag input.

In operation 540, the electronic device may determine whether the length of the drag input (which is also referred to as the distance of drag input) is larger than a predetermined threshold.

For example, the length of the drag input may be a distance at which the user's finger or a touch tool moves from where the touch is made by the finger or touch tool to where the touch is released in the display. Or, the length of the drag input may be a distance at which the user's finger or a touch tool moves from where a hovering of the finger or touch tool is recognized to where the recognition of the hovering is ended in the display.

Figure 6C:
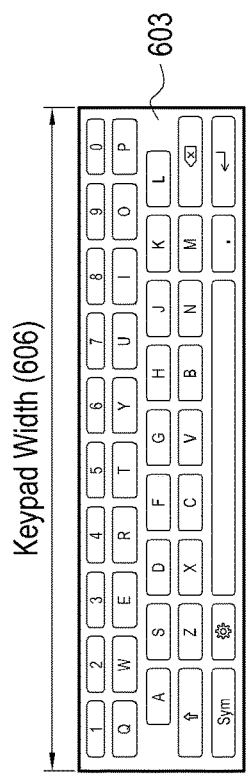

For example, the threshold may be proportionate to the horizontal size (or keypad width) 606 of the virtual keypad 603 as shown in FIG. 6C. The threshold may be determined by Equation 1 below.

$$\text{Threshold} = \text{horizontal size } 606 \text{ of virtual keypad}/n$$
$$(n >= 2, n \text{ is a positive integer}) \quad \text{Equation 1}$$

The electronic device may perform operation 550 when determining in operation 540 that the length of the drag input is larger than the predetermined threshold and may otherwise perform operation 530 again.

In operation 550, the electronic device may update the horizontal size of the virtual keypad. For example, the updated horizontal size of the virtual keypad may be the same as the horizontal size of a focused window.

In operation 560, the electronic device may vary the position of the virtual keypad to a lower portion of the focused window.

When the user drags the left-hand side 605 of the virtual keypad 603 to the right where the second window 602 is positioned as shown in FIG. 6B, if the length of the drag input is larger than the threshold, the electronic device may be positioned in the direction of the drag as shown in FIG. 6D, reduce the horizontal size of the virtual keypad 603 to the same size as the horizontal size 606 of the second window 602 focused, and position the virtual keypad 603 on a lower portion of the second window 602.

FIGS. 7A to 7D is views illustrating an operation screen for adjusting the size of the virtual keypad of the electronic device according to various embodiments of FIG. 5.

Referring to FIG. 7A, an electronic device may display a virtual keypad 703 for an application run on a second window 702 in the state of running a multi-window screen including a first window 701 and the second window 702.

Referring to FIG. 7A, the first window 701 and the second window 702, respectively, are separately displayed on a left-hand area and right-hand area, respectively, of a display screen, and the virtual keypad 703 may be displayed on the lower portion of the first window 701 and the second window 702.

The electronic device may sense a drag input in a right direction (e.g., towards the second window 702) on a left side 704 of the virtual keypad 703 while displaying the virtual keypad 703 as shown in FIG. 7A. When the length of the drag input is a threshold or more, the electronic device may reduce the horizontal size of the virtual keypad 703 to be the same as the horizontal size of the second window 702 and display the virtual keypad 703 on a lower portion of the second window 702 as shown in FIG. 7B. When the user drags the left side 704 of the virtual keypad 703 to the right where the second window 702 is positioned, the electronic device may reduce the size of the virtual keypad 703 by the length of the drag input in a horizontal direction while moving the left side 704 of the virtual keypad 703 to the right in proportion to the drag. When the length of the drag input upon termination of the drag is larger than the threshold, the electronic device may reduce the horizontal size of the virtual keypad 703 and position the virtual keypad 703 at a lower portion of the second window 702.

The electronic device may sense a drag in a left direction (e.g., towards the first window 701) on a left side 705 of the virtual keypad 703 displayed on the lower portion of the second window 702 while displaying the virtual keypad 703 on the lower portion of the second window 702 as shown in FIG. 7B. When the length of the drag input is a threshold or more, the electronic device may increase the horizontal size of the virtual keypad 703 to be the same as the sum of the horizontal size of the first window 701 and the horizontal size of the second window 702 and display the virtual keypad 703 on the lower portion of the first window 701 and the second window 702 as shown in FIG. 7A. When the user drags the left side 705 of the virtual keypad displayed on the lower portion of the second window 702 to the left where the first window 701 is positioned, the electronic device may increase the size of the virtual keypad 703 by the length of the drag in a horizontal direction while moving the left side 705 of the virtual keypad 703 to the left in proportion to the drag. When the length of the drag input upon termination of the drag is larger than the threshold, the electronic device may increase the horizontal size of the virtual keypad 703 and position the virtual keypad 703 at the lower portion of the first window 701 and the second window 702.

Referring to FIG. 7C, the electronic device may display a virtual keypad 703 for an application run on a first window 701 in the state of running a multi-window screen including the first window 701 and a second window 702.

Referring to FIG. 7C, the first window 701 and the second window 702, respectively, are separately displayed on a left-hand area and right-hand area, respectively, of a display screen, and the virtual keypad 703 may be displayed on the lower portion of the first window 701 and the second window 702.

The electronic device may sense a drag in a left direction (e.g., towards the first window 701) on a right side 706 of the virtual keypad 703 while displaying the virtual keypad 703 as shown in FIG. 7C. When the length of the drag is a threshold or more, the electronic device may reduce the horizontal size of the virtual keypad 703 to be the same as the horizontal size of the first window 701 and display the virtual keypad 703 on a lower portion of the first window 701 as shown in FIG. 7D. When the user drags the right side 706 of the virtual keypad 703 to the left where the first window 701 is positioned, the electronic device may reduce the size of the virtual keypad 703 by the length of the drag in a horizontal direction while moving the right side 706 of the virtual keypad 703 to the left in proportion to the drag. When the length of the drag input upon termination of the drag is larger than the threshold, the electronic device may reduce the horizontal size of the virtual keypad 703 to correspond to the horizontal size of the first window 701 and position the virtual keypad 703 at a lower portion of the first window 701.

The electronic device may sense a drag in a right direction (e.g., towards the second window 702) on a right side 707 of the virtual keypad 703 displayed on the lower portion of the first window 701 while displaying the virtual keypad 703 on the lower portion of the first window 701 as shown in FIG. 7D. When the length of the drag input is a threshold or more, the electronic device may increase the horizontal size of the virtual keypad 703 to be the same as the sum of the horizontal size of the first window 701 and the horizontal size of the second window 702 and display the virtual keypad 703 on the lower portion of the first window 701 and the second window 702 as shown in FIG. 7C. When the user drags the right side 707 of the virtual keypad 703 to the right where the second window 702 is positioned, the electronic device may increase the size of the virtual keypad 703 by the length of the drag in a horizontal direction while moving the right side 707 of the virtual keypad 703 to the right in proportion to the drag. When the length of the drag input upon termination of the drag is larger than the threshold, the electronic device may increase the horizontal size of the virtual keypad 703 and position the virtual keypad 703 at the lower portion of the first window 701 and the second window 702.

Figure 8:
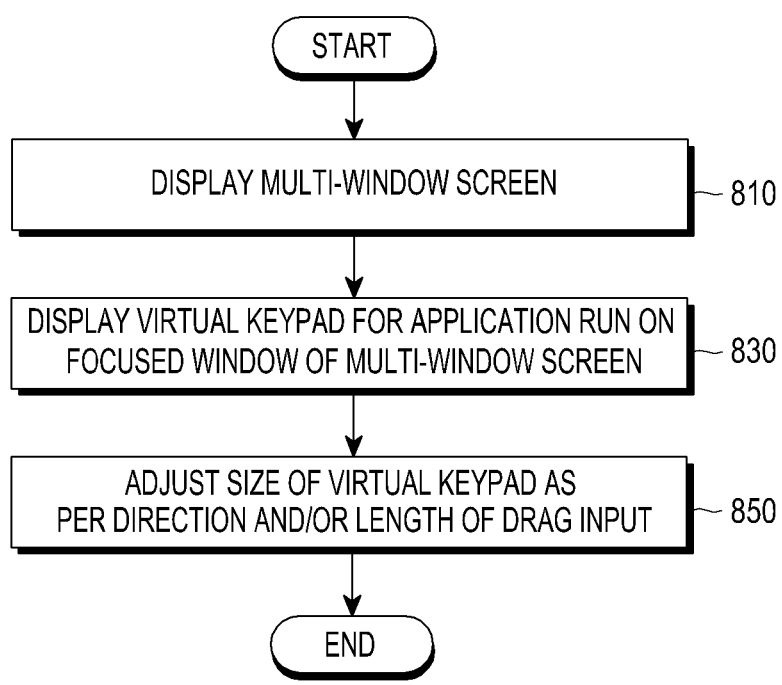
FIG. 8 is a flowchart illustrating operations for adjusting the size of a virtual keypad of an electronic device according to an embodiment of the present disclosure.

FIG. 8 is a flowchart illustrating operations for adjusting the size of a virtual keypad of an electronic device according to an embodiment of the present disclosure. FIGS. 9A to 9D are views illustrating an operation screen for adjusting the size of the virtual keypad of the electronic device according to various embodiments of the present disclosure.

Referring to FIG. 8 and FIGS. 9A to 9D, an electronic device may adjust the size of a virtual keypad according to a drag on the virtual keypad in a multi-window mode.

Figure 9A:
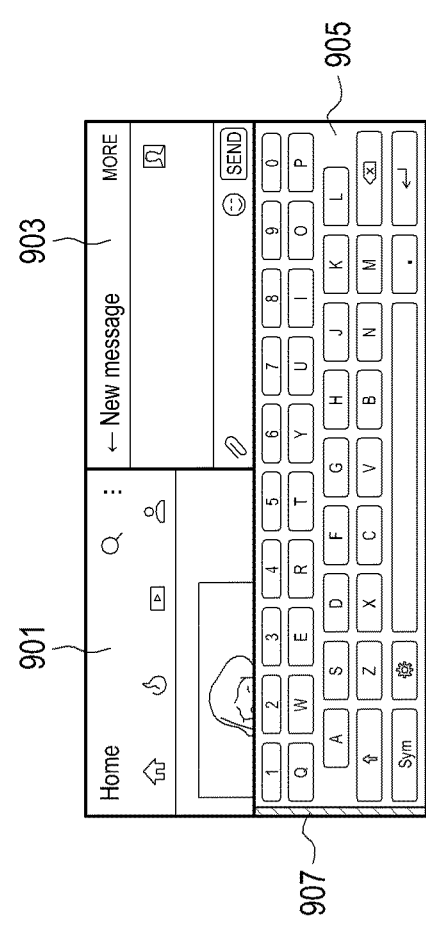
FIGS. 9A, 9B, 9C, and 9D are views illustrating an operation screen for adjusting the size of the virtual keypad of the electronic device according to various embodiments of the present disclosure.

In operation 810, the electronic device may display a multi-window screen. Referring to FIG. 9A, the electronic device, upon operating in the multi-window mode and in the horizontal mode as shown in FIG. 9A, may display a second window 903 at a right side of a first window 901 not to overlap the first window 901. The first window 901 may display an execution screen of a first application, and the second window 903 may display an execution screen of a second application.

Figure 9C:
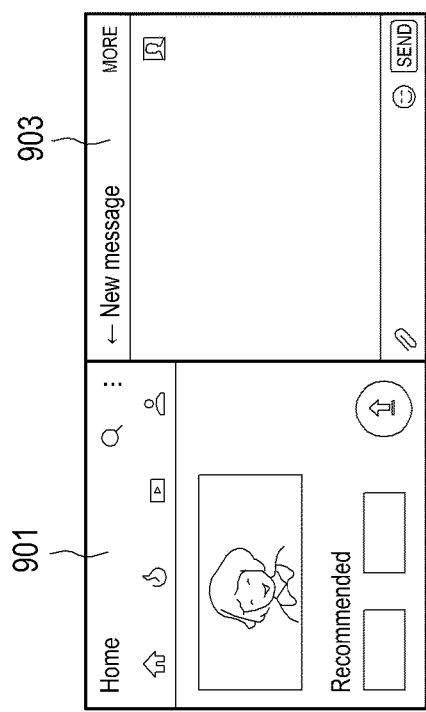
Figure 9B:
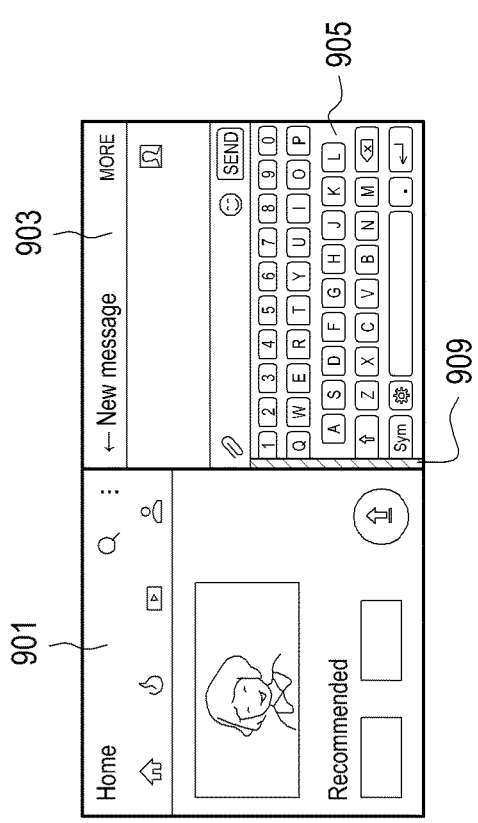

In operation 830, the electronic device may display a virtual keypad for an application run on the window that is focused on the multi-window screen. Referring to FIGS. 9A and 9B, upon receiving a user input for running a virtual keypad for the second application run on the second window 903 while displaying the first window 901 and the second window 602 in the horizontal mode as shown in FIG. 9A, the electronic device may display a virtual keypad 905 on the lower portion of the first window 901 and the second window 903 as shown in FIG. 9B.

In operation 850, the electronic device may adjust the size of the virtual keypad according to the direction and/or length of the drag input.

For example, when the user touches and drags an edge portion of the virtual keypad, the electronic device may reduce or increase the size of the virtual keypad in the direction of the drag in proportion to the length of the drag. When the user touches a left side 907 of the virtual keypad and then drags to the right (where the second window 903 is positioned) as shown in FIG. 9B, the electronic device may reduce the horizontal size of the virtual keypad 905 while moving the virtual keypad 905 to the right in proportion to the length of the drag as shown in FIG. 9C. When the drag is released at the boundary between the first window 901 and the second window 903, the virtual keypad 905 of which the horizontal size has been reduced may be displayed on a lower portion of the second window 903 as shown in FIG. 9D.

Figure 9D:
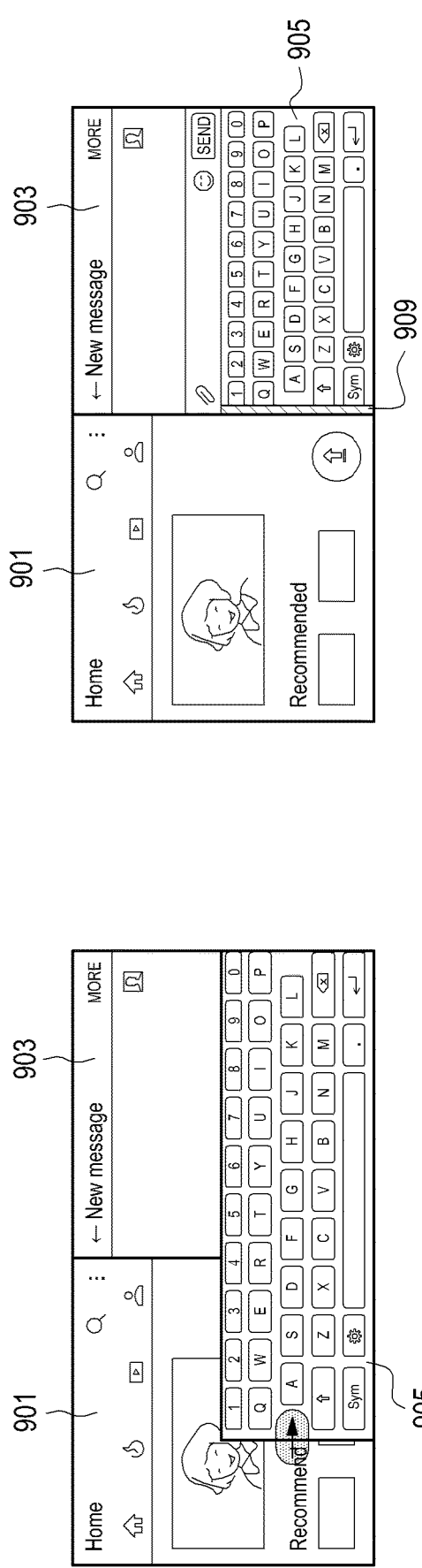

As another example, when the user touches a left side 909 of the shrunken virtual keypad 905 displayed on the lower portion of the second window 903 and then drags to the left (where the first window 901 is positioned) as shown in FIG. 9D, the electronic device may reduce the horizontal size of the virtual keypad 905 while moving the virtual keypad 905 to the left in proportion to the length of the drag. When the drag is terminated at a left boundary of the first window 901, the virtual keypad 905 of which the horizontal size has been increased may be displayed on the lower portion of the first window 901 and the second window 903 as shown in FIG. 9B.

As another example, when the user touches a right side of the virtual keypad 905 and then drags to the left, the electronic device may reduce the horizontal size of the virtual keypad 905 while moving the virtual keypad 905 to the left in proportion to the length of the drag. When the drag is released at the boundary between the first window 901 and the second window 903, the virtual keypad 905 of which the horizontal size has been reduced may be displayed on the lower portion of the first window 901.

As another example, when the user touches a right side of the shrunken virtual keypad 905 displayed on the lower portion of the first window 901 and then drags to the left, the electronic device may increase the horizontal size of the virtual keypad 905 while moving the virtual keypad 905 to the left in proportion to the length of the drag. When the drag is terminated at a right boundary of the second window 903, the virtual keypad 905 of which the horizontal size has been increased may be displayed on the lower portion of the first window 901 and the second window 903.

Figures 10A, 10B:
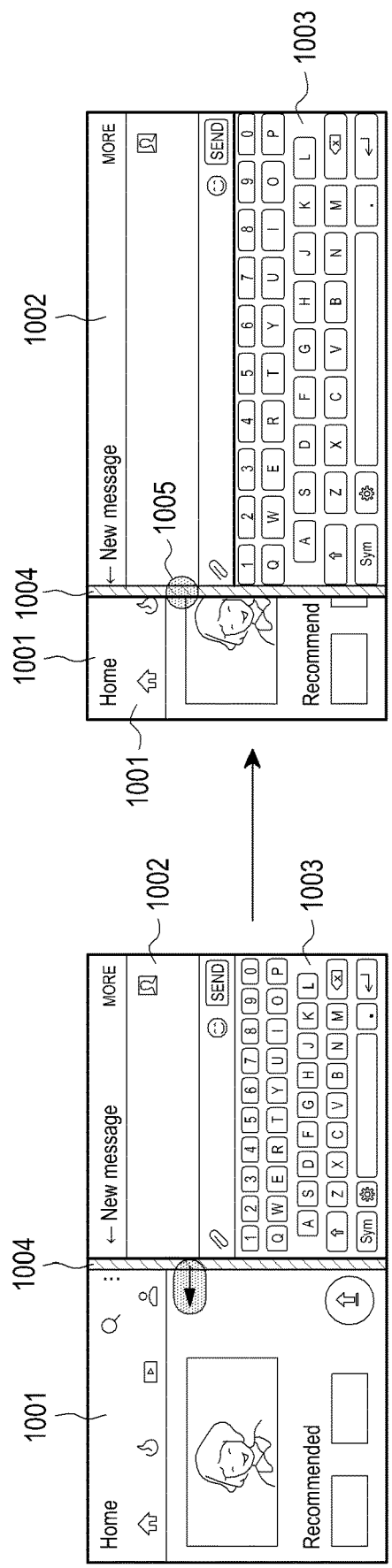
FIGS. 10A and 10B are a view illustrating an operation screen for adjusting the size of a virtual keypad of an electronic device by adjusting screen width between windows included in a multi-window screen according to various embodiments of the present disclosure.
Figure 12A:
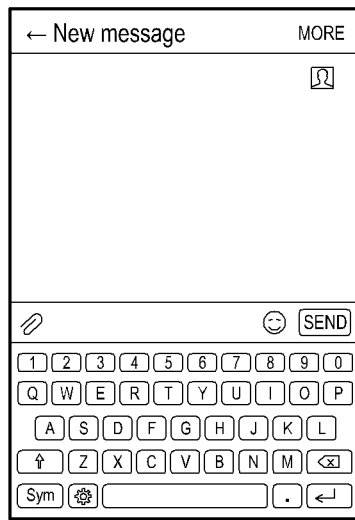
FIGS. 12A, 12B, and 12C are views illustrating examples of screens displayed on a display of the electronic device according to the related art.
Figure 12B:
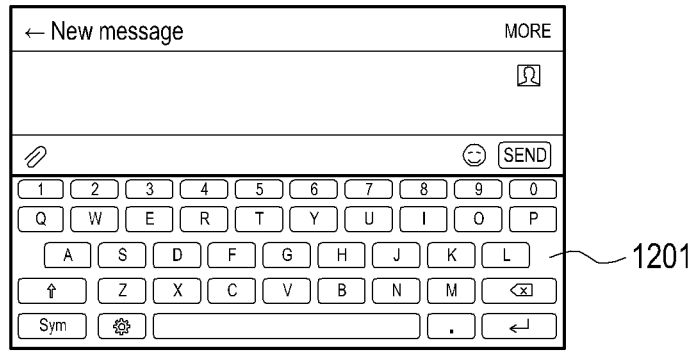
Figure 12C:
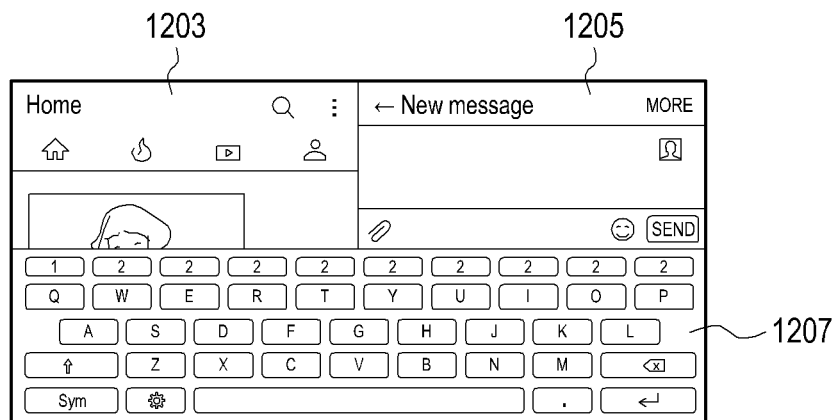

FIGS. 10A and 10B are views illustrating an operation screen for adjusting the size of a virtual keypad of an electronic device by adjusting screen width between windows included in a multi-window screen according to various embodiments of the present disclosure.

Referring to FIGS. 10A and 10B, an electronic device may display a virtual keypad 1003 for an application run on a second window 1002 in the state of running a multi-window screen including a first window 1001 and the second window 1002 that is displayed at a right side of the first window 1001 not to overlap the first window 1001. The electronic device may display the virtual keypad 1003 having the same horizontal size as the second window 1002 on a lower portion of the second window 1002.

When the user touches the boundary 1004 between the first window 1001 and the second window 1002, then drags in one direction (e.g., to the left), and then terminates the drag as shown in FIG. 10B, the electronic device may enable the point 1005 where the drag is terminated to be the boundary between the first window 1001 and the second window 1002 as shown in FIG. 10B. At this time, the horizontal size of the virtual keypad 1003 may be varied to correspond to the horizontal size of the second window 1002. For example, when the user touches and then drags the boundary 1004 between the first window 1001 and the second window 1002, the electronic device may vary the horizontal size of the first window 1001 and the second window 1002 in proportion to the drag, and the horizontal size of the virtual keypad 1003 may also be varied in proportion to the drag.

FIGS. 11A to 11D are views illustrating a movement of a cursor in a text entry area between two applications run on a multi-window screen according to various embodiments of the present disclosure.

Referring to FIG. 11A, an electronic device may display a virtual keypad 1103 for a second application run on a second window 1102 on the lower portion of the first window 1101 and the second window 1102 in the state of running a multi-window screen including a first window 1101 and the second window 1102. Referring to FIG. 11A, the electronic device may display a cursor on a text entry area 1104 of the second application.

Upon sensing a user input (e.g., a touch) on a user interface 1105 for text entry in a first application run on the first window 1101 as shown in FIG. 11A, the electronic device may terminate the display of the cursor on the text entry area 1104 of the second application and display a cursor on a text entry area 1106 of the first application as shown in FIG. 11B.

Referring to FIG. 11C, the electronic device may display a virtual keypad 1103 for a second application run on the second window 1102 on the lower portion of the second window 1102 in the state of running a multi-window screen including the first window 1101 and the second window 1102. The electronic device may also display a cursor on a text entry area 1104 of the second application.

Upon sensing a user input (e.g., a touch) on the user interface 1105 for text entry in the first application run on the first window 1101 as shown in FIG. 11C, the electronic device may terminate the display of the virtual keypad 1103 on the lower portion of the second application and display a virtual keypad 1103 having the same horizontal size as the first window on the lower portion of the first application as shown in FIG. 11B. The electronic device may also display a cursor on the text entry area 1106 of the first application.

According to an embodiment of the present disclosure, a method for controlling a display in an electronic device may comprise displaying a first window for running a first application and a second window for running a second application on a touchscreen of the electronic device, displaying a virtual keypad on a portion of the first window and a portion of the second window corresponding to a first input to a focused window of the first window and the second window, and varying a size of the virtual keypad corresponding to a second input to the virtual keypad.

For example, varying the size of the virtual keypad may include, when a drag input on a side of the virtual keypad is received, and a length of the drag input is a designated threshold or more, varying the size of the virtual keypad into a designated size according to a direction of the drag input and displaying the virtual keypad.

For example, a left side of the virtual keypad may be positioned on a left side of the first window, and a right side of the virtual keypad may be positioned on a right side of the second window that is disposed in parallel with the first window.

For example, varying the size of the virtual keypad may include, when a drag input from a left side of the virtual keypad to a right side of the virtual keypad is received, and a length of the drag input is a designated threshold or more, varying the size of the virtual keypad so that the left side of the virtual keypad is positioned on a left side of the second window and displaying the virtual keypad, and when a drag input from a right side of the virtual keypad to a left side of the virtual keypad is received, and a length of the drag input is a designated threshold or more, varying the size of the virtual keypad so that the right side of the virtual keypad is positioned on a right side of the first window and displaying the virtual keypad.

For example, varying the size of the virtual keypad may include, when a drag input on a side of the virtual keypad is received, varying the size of the virtual keypad in a direction of the drag in proportion to a length of the drag input and displaying the virtual keypad.

For example, the touchscreen may have a rectangular shape with a horizontal size and a vertical size different from the horizontal size. The electronic device may be operated in a horizontal mode where the first window and the second window are displayed in parallel with each other in a vertical direction of the touchscreen. The first window and the second window may not overlap each other.

For example, the virtual keypad may be positioned on any one portion of the first window. Varying the size of the virtual keypad may include, when a drag input for a boundary between the first window and the second window is received, moving the boundary in a direction of the drag input for the boundary in proportion to a length of the drag input for the boundary to adjust a horizontal size of the first window, the second window, and the virtual keypad.

As used herein, the term "module" includes a unit configured in hardware, software, or firmware and may interchangeably be used with other terms, e.g., "logic," "logic block," "part," or "circuit." The module may be a single integral part or a minimum unit or part of performing one or more functions. The module may be implemented mechanically or electronically and may include, e.g., an application-specific integrated circuit (ASIC) chip, field-programmable gate arrays (FPGAs), or programmable logic device, that has been known or to be developed in the future as performing some operations. According to an embodiment of the present disclosure, at least a part of the device (e.g., modules or their functions) or method (e.g., operations) may be implemented as instructions stored in a computer-readable storage medium (e.g., the memory 130), e.g., in the form of a program module. The instructions, when executed by a processor (e.g., the processor 120), may enable the processor to carry out a corresponding function. The computer-readable medium may include, e.g., a hard disk, a floppy disc, a magnetic medium (e.g., magnetic tape), an optical recording medium (e.g., compact disc-ROM (CD-ROM), DVD, magnetic-optical medium (e.g., floptical disk), or an embedded memory. The instruction may include a code created by a compiler or a code executable by an interpreter. Modules or programming modules in accordance with various embodiments of the present disclosure may include at least one or more of the aforementioned components, omit some of them, or further include other additional components. Operations performed by modules, programming modules or other components in accordance with various embodiments of the present disclosure may be carried out sequentially, in parallel, repeatedly or heuristically, or at least some operations may be executed in a different order or omitted or other operations may be added.

As is apparent from the forgoing description, according to various embodiments of the present disclosure, the electronic device and the method for controlling the display in the electronic device may allow the user to adjust the keypad displayed on the display screen of the electronic device into a desired size. For example, according to various embodiments of the present disclosure, the user may adjust the keypad displayed on the display screen of the electronic device into a desired size in the multi-window mode.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device, comprising:
  a touchscreen display having a display area, and
  at least one processor configured to:
    display, on the touchscreen display, a first execution screen of a first application and a second execution screen of a second application side by side, wherein the first execution screen and the second execution screen together occupy an entirety of the display area of the touchscreen display,
    receive a first user input for displaying a virtual keypad while the first execution screen and the second execution screen are displayed side by side and occupy the entirety of the display area of the touchscreen display, the virtual keypad including a plurality of keys respectively representing a plurality of characters, and
    in response to the first user input, display together, on the touchscreen display, the virtual keypad, a part of the first execution screen, and a third execution screen of the second application smaller than the second execution screen, wherein the part of the first execution screen, the third execution screen, and the virtual keypad occupy the entirety of the display area of the touchscreen display.

2. The electronic device of claim 1, wherein the first execution screen and the second execution screen are displayed in a horizontal mode.

3. The electronic device of claim 1, wherein the virtual keypad is displayed in a horizontal direction.

4. The electronic device of claim 1, wherein the virtual keypad is a single keypad.

5. The electronic device of claim 1, wherein the at least one processor is further configured to:
  receive a second user input for reducing display sizes of the plurality of keys of the virtual keypad, and
  in response to the second user input, display together, on the touch screen display, the plurality of keys having the reduced display sizes, the part of the first execution screen, and the third execution screen.

6. The electronic device of claim 5, wherein the second user input includes a drag gesture.

7. The electronic device of claim 5, wherein the second user input is received substantially on an edge of the plurality of keys.

8. A method for controlling an electronic device, comprising:
  displaying, on a touchscreen display of the electronic device, a first execution screen of a first application and a second execution screen of a second application side by side, the touchscreen display including a display area, and the first execution screen and the second execution screen together occupying an entirety of the display area of the touchscreen display;
  receiving a first user input for displaying a virtual keypad while the first execution screen and the second execution screen are displayed side by side and occupy the entirety of the display area of the touchscreen display, the virtual keypad including a plurality of keys respectively representing a plurality of characters; and in response to the first user input, displaying together, on the touchscreen display, the virtual keypad, a part of the first execution screen, and a third execution screen of the second application smaller than the second execution screen, wherein the part of the first execution screen, the third execution screen, and the virtual keypad occupy the entirety of the display area of the touchscreen display.

9. The method of claim 8, wherein the virtual keypad is displayed in a horizontal direction.

10. The method of claim 8, wherein the virtual keypad is a single keypad.

11. The method of claim 8, further comprising:
receiving a second user input for reducing display sizes of the plurality of keys of the virtual keypad; and
in response to the second user input, displaying together, on the touch screen display, the plurality of keys having the reduced display sizes, the part of the first execution screen, and the third execution screen.

12. The method of claim 11, wherein the second user input includes a drag gesture.

13. The method of claim 11, wherein the second user input is received substantially on an edge of the plurality of keys.

* * * * *